US012765364B2

(12) United States Patent
Venigalla et al.

(10) Patent No.: US 12,765,364 B2
(45) Date of Patent: Oct. 13, 2026

(54) TIER RECESS METHOD

(71) Applicant: Micron Technology, Inc., Boise, ID (US)

(72) Inventors: Rajasekhar Venigalla, Boise, ID (US); Justin David Shepherdson, Meridian, ID (US); Hiroaki Iuchi, Boise, ID (US); Vladimir Samara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 360 days.

(21) Appl. No.: 18/615,285

(22) Filed: Mar. 25, 2024

(65) Prior Publication Data

US 2024/0332179 A1 Oct. 3, 2024

Related U.S. Application Data

(60) Provisional application No. 63/455,519, filed on Mar. 29, 2023.

(51) Int. Cl.

| | |
|---|---|
| ***H10W 20/41*** | (2026.01) |
| ***G11C 16/04*** | (2006.01) |
| ***H10B 41/20*** | (2023.01) |
| ***H10B 41/35*** | (2023.01) |
| ***H10B 43/20*** | (2023.01) |
| ***H10B 43/35*** | (2023.01) |
| ***H10W 20/00*** | (2026.01) |

(52) U.S. Cl.
CPC ....... *H10W 20/435* (2026.01); *G11C 16/0483* (2013.01); *H10B 41/20* (2023.02); *H10B 41/35* (2023.02); *H10B 43/20* (2023.02); *H10B 43/35* (2023.02); *H10W 20/033* (2026.01)

(58) Field of Classification Search
CPC .. H10W 20/435; G11C 16/0483; H10B 41/20
See application file for complete search history.

(56) References Cited

U.S. PATENT DOCUMENTS

2023/0129619 A1* 4/2023 Ok ..................... G11C 13/0004 365/163
2024/0138149 A1* 4/2024 Zhou ..................... H10B 43/50

* cited by examiner

*Primary Examiner* — Marvin Payen
(74) *Attorney, Agent, or Firm* — Schwegman Lundberg & Woessner, P.A.

(57) ABSTRACT

A method for making a vertical contact through levels of a memory device. A first liner is formed in an opening, and a second liner is formed over the first liner. The first liner is selectively removed from under the second liner to expose a first portion of the opening, such that the first liner remains intact over a second portion of the opening. The second liner is then removed, leaving the first liner overlying the second portion of the opening. A first portion of each of the layers of nitride materials in the first portion of the opening uncovered by the first liner is removed, the second portion of the first liner is removed, and a second portion of each of the layers of the nitride materials is removed in the second portion of the opening, wherein the second portion is less than the first portion.

16 Claims, 13 Drawing Sheets

TIER RECESS METHOD

PRIORITY APPLICATION

This application claims the benefit of priority to U.S. Provisional Application Ser. No. 63/455,519, filed Mar. 29, 2023, which is incorporated herein by reference in its entirety.

BACKGROUND

Memory devices are provided as internal, semiconductor integrated circuits in computers or other electronic devices. Flash memory is utilized as non-volatile memory for a wide range of electronic applications. The memory density (e.g., the number of memory cells per memory die) of memory devices, such as non-volatile memory devices (e.g., NAND Flash memory devices) has been increased through implementation of vertical memory array (also referred to as a "three-dimensional (3D) memory array") architectures.

A conventional vertical memory array includes a plurality of memory cell pillars extending through tiers formed from a stack of alternating substantially planar layers of dielectric materials and conductive materials. The memory cell pillars include a channel region positioned between a source region and a drain region, and the conductive layers in the tiers function as control gates in the completed device. The vertical configuration permits a greater number of electrical components (e.g., transistors) to be located in a unit of die area by building the array upwards (e.g., longitudinally, vertically) on a die, as compared to structures with conventional planar (e.g., two-dimensional) arrangements of electrical components.

To form the channel regions of the memory cell pillars, a first etch process is conducted to create, through a deck of tiers of alternating dielectric and nitride structures, a tapered high aspect ratio opening along a direction normal to a plane of a the die or other support layer underlying the tier stack. A second etch process selectively etches away at least a portion of the layers of the nitride materials in regions of the tier stack adjacent to walls of the tapered opening, and leaves intact the dielectric layers. In subsequent process steps, the regions previously occupied by the nitride layers are replaced with conductive materials, which form the control gates.

Increasing aspect ratios of the openings used to form the memory cell pillars, as well as increasing numbers of alternating conductive and nonconductive layers in the stack, make control of the selective nitride layer etch process increasingly difficult along the tapered opening.

BRIEF DESCRIPTION OF THE DRAWINGS

The drawings, which are not necessarily drawn to scale, illustrate generally, by way of example, but not by way of limitation, various embodiments discussed in the present document.

Figure 1:
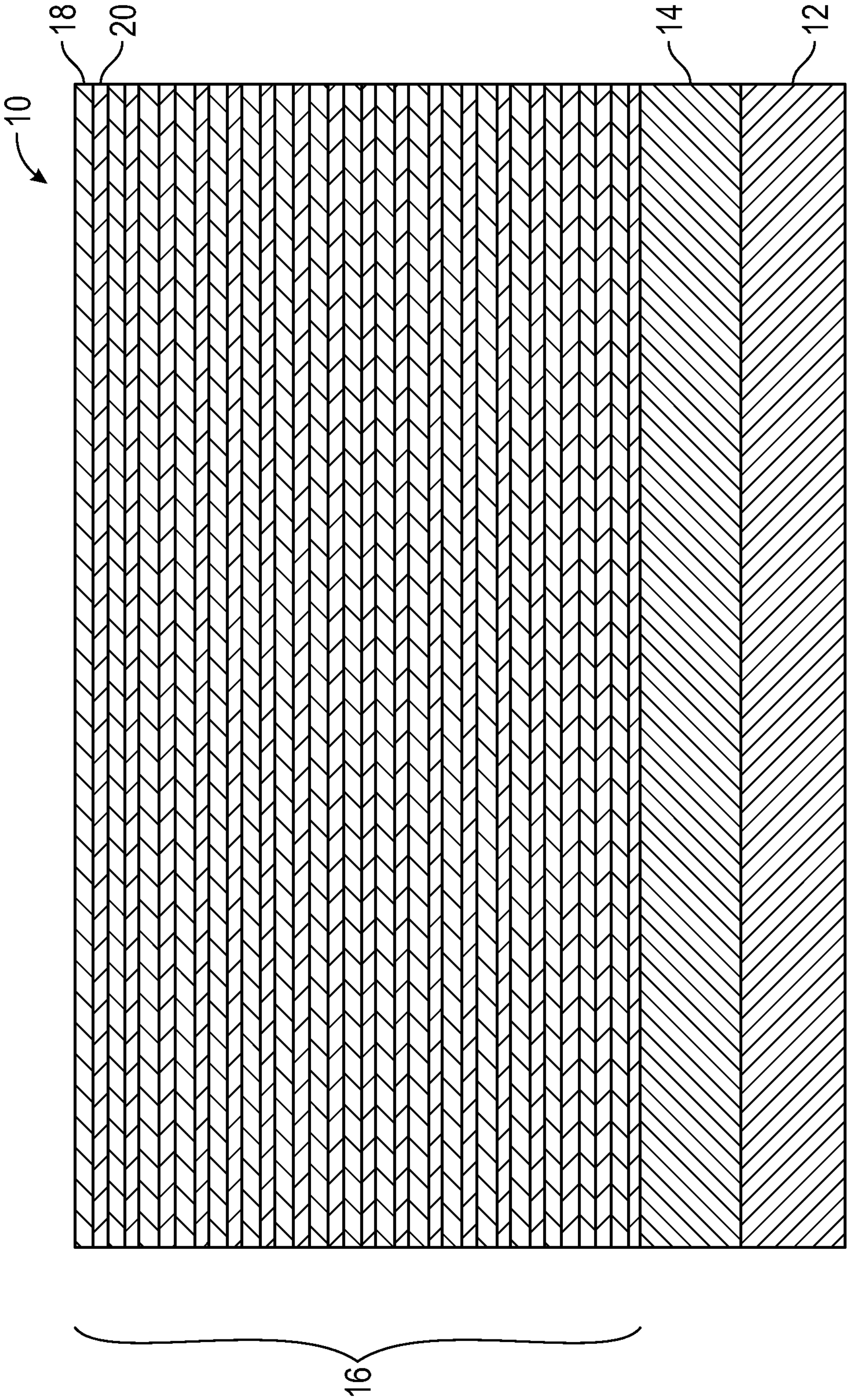
FIG. 1 is a schematic cross-sectional view of a workpiece including a tier stack of alternating layers of dielectric materials and nitride materials that is suitable for use in the methods of the present disclosure for forming a cell in a memory cell array, according to various embodiments.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

Like symbols in the drawings indicate like elements.

DETAILED DESCRIPTION

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments.

The following description provides specific details, such as material types, material thicknesses, and process conditions to provide a thorough description of embodiments described herein. However, a person of ordinary skill in the art will understand that the embodiments disclosed herein may be practiced without employing these specific details, and the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for case of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "pitch" refers to the distance between identical points in two adjacent (i.e., neighboring) features.

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term “exhume” refers to a selective etching step in which all or a portion of a first layer is etched from below a second layer overlying the first layer.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Process techniques and workpiece designs discussed herein can be used to more effectively control selective nitride etching steps such as along a tapered opening used to form a vertical conductive structure such as, for example, a memory cell pillar in a memory device. After a tapered opening is formed in a tier including a stack of a plurality of alternating layers of dielectric materials and nitride materials, in subsequent process steps, the layers of nitride materials along the exposed walls of the tapered opening are selectively etched away, leaving the layers of the dielectric materials substantially intact. The selective nitride etch proceeds at the same rate along the walls of the opening. However, since the opening is tapered, the etch back of the nitride layers can provide different etch depths in various regions of the opening. The differing etch depths can leave behind dielectric structures of different lengths in the various regions of the opening. Longer dielectric structures can, in some cases, can bend, distort, or short against adjacent dielectric structures, which can cause defects during subsequent process steps.

In some examples, the present disclosure is directed to improved process steps and workpiece designs that make possible improved control of nitride etch depths along the tapered opening. Enhanced control of nitride etch depths can leave intact dielectric structures with enhanced resistance to failure during downstream process steps such as, for example, during replacement of the layers of nitride materials with layers of conductive materials. In some examples, the reduced failure rates in the uniformly sized dielectric structures improves the quality of the semiconductor device and can reduce overall production costs.

In one aspect, the present disclosure is directed to a method for making a memory element for use in semiconductor device such as, for example, a vertically stacked NAND memory array. As noted above, an array of tapered openings may be etched into each deck of tiers of alternating conducting and insulating structures along a direction normal to a plane of a the die or other support layer underlying the tier stack. In an example of the present disclosure, a first etch stop liner is applied in the tapered opening to overlie the walls and bottom surface of the opening, and a second etch stop liner is applied over at least a portion of the first etch stop liner. A portion of the first etch stop liner may be exhumed from under the second etch stop liner to expose selected regions of the walls of the opening, and the tier stack may be selectively etched to remove a predetermined amount of the layers of nitride materials in the exposed regions of the tier stack.

In one example, which is not intended to be limiting, a first portion of a first etch stop liner is exhumed from beneath a second etch stop liner to expose the sidewalls in a first region of the tapered opening, and a second portion of the first etch stop liner remains intact over the sidewalls in a predetermined second region of the opening.

A first tier stack etch step may then be used to selectively remove the layers of the nitride materials in the first region of the opening that were previously protected by the first portion of the first etch stop liner, and leaves substantially intact the layers of the dielectric materials in the first region of the opening. The first tier stack etch step thus forms a first set of cantilevered dielectric arms in the tier stack in the first region of the opening, and the first set of cantilivered dielectric arms have a first length.

The second etch stop liner and the second portion of the first etch stop liner are then removed from the tapered opening, and a second tier stack etch step can be used to selectively remove the layers of the nitride materials in the second region of the opening that were previously protected by the second portion of the first liner, and leaves intact the layers of the dielectric materials in the second region of the opening. The second tier stack etch forms a second set of cantilevered dielectric arms in tier stack in the second regions of the opening, and the second set of cantilivered dielectric arms have a second length that is less than the first length of the first set of cantilevered dielectric arms.

Any number of etch stop liners may be successively formed in the tapered opening to create sets of cantilevered dielectric arms with any desired length along the walls of the opening, with the cantilevered dielectric arms proximal the first region of the opening generally having a greater length than the cantilevered dielectric arms proximal the second region of the opening.

The successively applied etch stop liners thus provide enhanced control over the selective etching of the layers of the nitride materials and the resulting length of the remaining cantilevered dielectric arms in the tier stack along the walls of the opening. More uniform cantilevered dielectric arms can substantially reduce or eliminate damage to the cantilevered dielectric arms in subsequent processing steps caused by, for example, bending, shorting, breakage, and the like.

After the final tier stack etch, the resulting workpiece may be utilized in a conventional manner to form a semiconductor device such as, for example, a vertically stacked NAND array. For example, the layers of the nitride materials in the tier stack are ultimately replaced by conductive materials to form control gates in the completed semiconductor device. The method and workpiece of the present disclosure can thus provide a more repeatable process for forming the contacts to the conductive pillars that are formed in the tapered opening in downstream process steps. As the tapered openings become smaller and number of layers in the tier stack more numerous, the workpiece and process of the present disclosure can be used to manufacture a more reliable semiconductor device with increased data storage capacity.

Various embodiments of the method and workpieces of the present disclosure are discussed in detail below.

FIG. 1 is a schematic representation, which is not to scale, of a workpiece 10 utilized in a process for making a semiconductor device such as, for example, a vertical NAND memory cell. The workpiece 10 includes a substrate 12, an insulating layer 14, and a tier deck 16. The insulating layer 14 is formed over an electrically conductive material (not shown in FIG. 1) configured to, for example, route signals to and/or from the electrically conductive material. The substrate 12 may include multiple portions that support and/or isolate one or more other conductive materials and insulative materials for routing the signals to and/or from the electrically conductive material in or adjacent to the insulating layer 14. For example, the substrate 12 may include one or more conductive materials where circuitry (e.g., control units) and/or interconnections are provided for routing the signals.

The tier deck 16 includes a stack formed from a plurality of pairs of alternating layers of dielectric materials 18 and nitride materials 20. As shown in FIG. 1, the alternating pairs of layers 18, 20 are arranged in planes substantially parallel to a plane of the underlying supporting insulating layer 14 and substrate 12. The tier deck 16 can include any suitable number of layers 18, 20, which have a thickness on the order of about 10 nm to about 100 nm, and the depiction in FIG. 1 is only provided as an example. The layer stack 16 and layers 18, 20 may be formed using conventional techniques.

Figure 2:
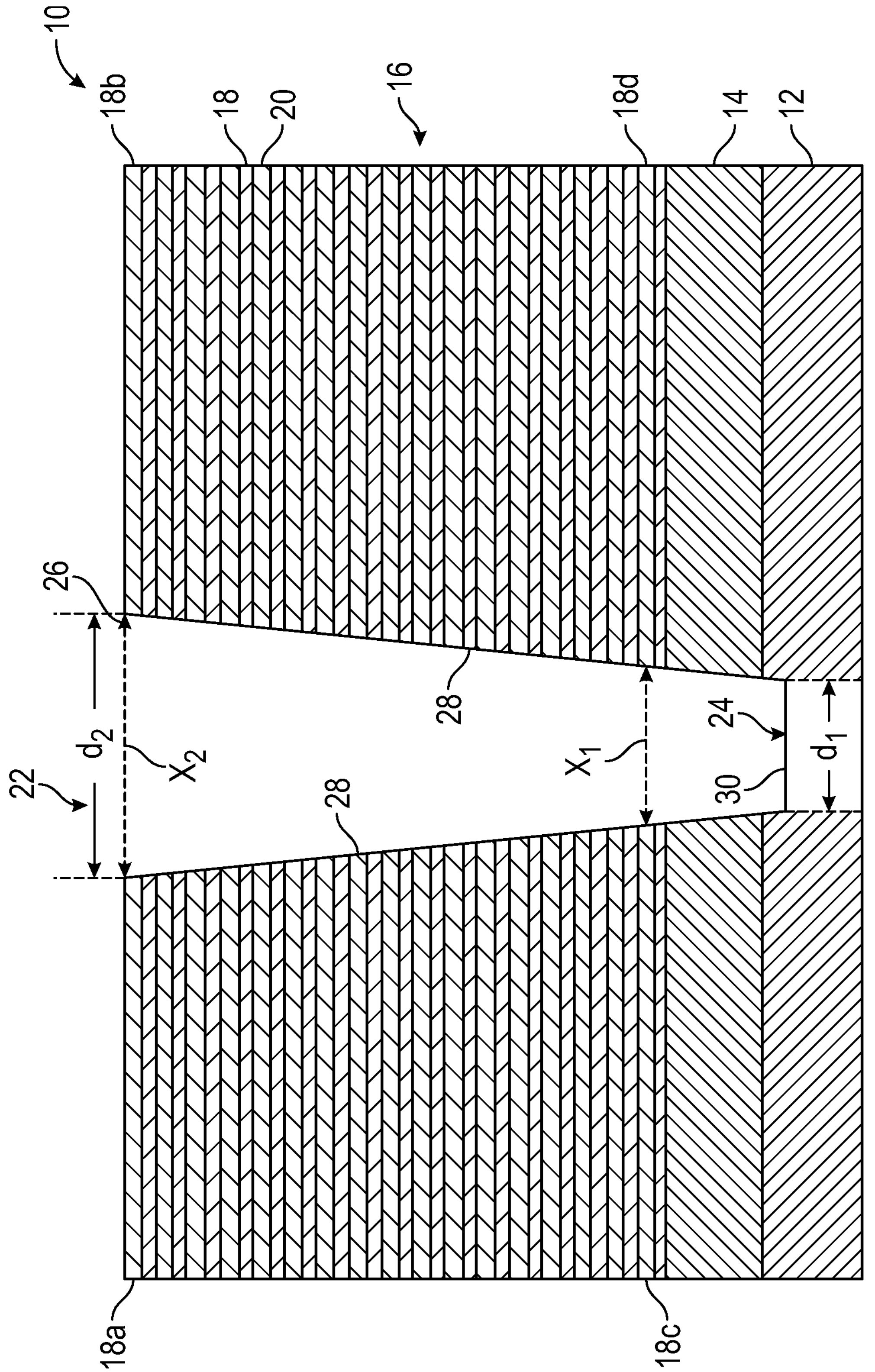
FIG. 2 is a schematic cross-sectional view of a tapered opening formed in the tier stack of FIG. 1, according to various embodiments.

Referring now to FIG. 2, an etch step can be utilized to form an arrangement of tapered openings 22 in the tier stack 16. The openings 22 can be formed in the tier stack in a wide variety of arrays and pitches, depending on the intended application. In subsequent process steps each of the openings 22 will be filled with a conductive material to form memory cell pillars (not shown in FIG. 2).

As shown in FIG. 2, the opening 22 extends in a direction substantially normal to a plane of the alternating layers of dielectric materials and nitride materials 18, 20 in the tier stack 16, and a plane of the supporting substrates 12, 14. The opening 22 extends from a first end 24 to a second end 26. As illustrated in FIG. 2, the opening 22 has a substantially trapezoidal cross-sectional shape that tapers from a first diameter $d_1$ at the second end 26 to a second diameter $d_2$ at the first end 24, wherein $d_2$ is greater than $d_1$.

The tapered shape creates pairs of opposed contacts across the opening 22, which may be separated by different lengths, depending on their location in the stack 16 with respect to the supporting substrates 12, 14. For example, the opposed contacts 18*a*, 18*b* proximal to the second end 26 of the opening 22 are separated by a distance $x_2$, while the opposed contacts 18*c*, 18*d* are separated by a distance $x_1$, and $x_2$ is greater than $x_1$. Thus, the distance between opposed contacts constantly decreases from the second end 26 to the first end 24 of the opening 22.

The tapered openings 22 include sloping sidewalls 28 that bound the stacked pairs of layers of dielectric materials and nitride materials 8, 20, as well as a bottom surface 30. In the example of FIG. 2, the tapered opening 22 extends through the insulating layer 14 and terminates in the substrate 12, although many different depths of the tapered opening 22 are possible. In the example of FIG. 2, the bottom surface 30 of the tapered opening 22 resides within the substrate layer 12.

Figure 3:
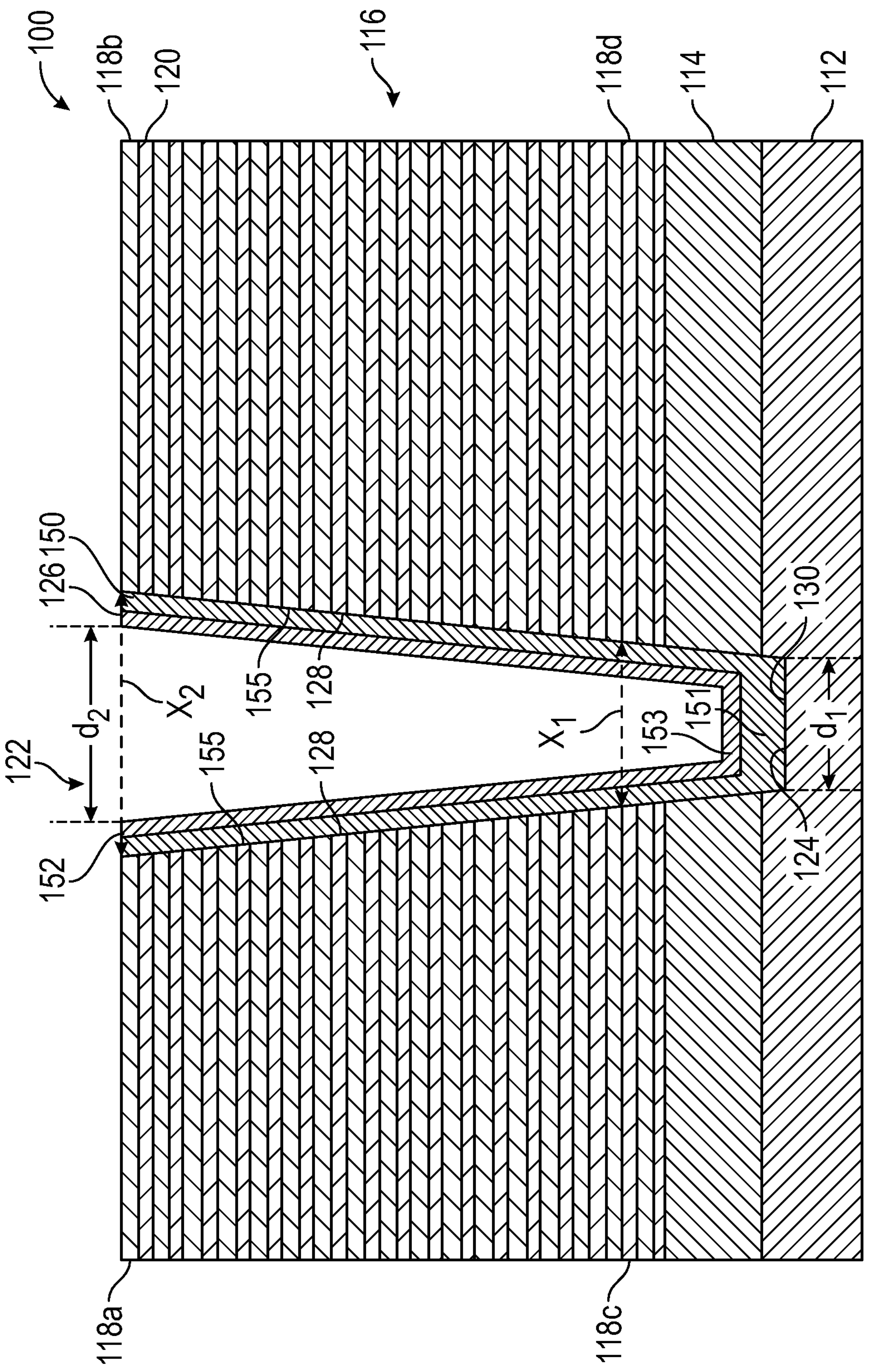
FIG. 3 is a schematic cross-sectional view of a workpiece suitable for forming a cell in a memory cell array, the workpiece including a first etch resistant liner deposited in the tapered opening of FIG. 2, and a second etch resistant liner deposited over the first etch resistant liner, according to various embodiments.

Referring now to FIG. 3, a workpiece 100 includes a substrate 112, an insulating layer 114 on the substrate 112, and a tier stack 116 on the insulating layer 114. The tier stack 116 includes a plurality of pairs of layers of dielectric materials 118 and nitride materials 120 in an alternating arrangement. The layers 118, 120 are arranged substantially parallel to the planes of the underlying support layers 112, 114.

The dielectric layers 118 are formed from a dielectric material including, but not limited to, a silicon oxide ($SiO_x$), such as silicon dioxide ($SiO_2$), phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof. The material in the layers 120 is a nitride material including, but not limited to, a silicon nitride (SiN). In some examples, the dielectric material in the layers 118 is $SiO_2$, and the nitride material in the layers 120 is SiN.

The tier stack 116 includes a tapered opening 122 which, in subsequent process steps, can be filled with a conductive material to form, for example, a memory cell pillar. The opening 122 extends in a direction substantially normal to a plane of the layers 118, 120 in the tier stack 116, and extends from a first end 124 to a second end 126. The opening 122 has a substantially trapezoidal cross-sectional shape that tapers from a first diameter $d_1$ to a second diameter $d_2$, wherein $d_2$ is greater than $d_1$.

The tapered shape creates pairs of opposed contacts across the diameter of the opening 122, which may be separated by different lengths, depending on their location in the stack 116 with respect to the supporting substrates 112, 114. For example, the opposed contacts 118*a*, 118*b* proximal the second end 126 of the opening 122 are separated by a distance $x_2$, while the opposed contacts 118*c*, 118*d* are separated by a distance $x_1$, and $x_2$ is greater than $x_1$. Thus, the distance between opposed contacts constantly decreases from the second end 126 to the first end 124 of the opening 122.

The opening 122 includes substantially linear sidewalls 128 that bound the stacked pairs of layers of dielectric materials and nitride materials 118, 120, as well as a bottom surface 130. In the workpiece 100, the opening 122 is covered by a plurality of etch stop liners, and in the embodiment of FIG. 3 includes a first etch stop liner 150 covering the sidewalls 128 and bottom surface 130 of the opening 122. In some examples, which are not intended to be limiting, the first etch stop liner 150 is formed from a material including, but not limited to, carbon. The carbon materials forming the liner 150 can optionally include a modifying compound such as boron, a metal, or mixtures and combinations thereof. In some examples, which are not intended to be limiting, the percentage of boron and the percentage of a metal in the carbon-containing etch stop layer 150 are selected to be about 1 wt % to about 10 wt %, based on the total weight of the layer.

In some examples, the etch-stop liner 150 can have a varying composition with essentially carbon at the top of the opening to carbon with a percentage of other materials incorporated in the carbon at the end of the liner near the bottom of the opening At least a portion of the first etch stop liner 150 is in turn overlain by a second etch stop liner 152. For example, in some cases, as shown in FIG. 3, a portion 153 of the second etch stop liner 152 covers a portion 151 of the first etch stop liner 150 that overlies the bottom surface 130 of the opening 122. In some examples, the second etch stop liner 152 overlies the portions 155 of the first etch stop liner 150 that cover the sidewalls 128 of the opening 122, but does not overlie the portion 151 of the first etch stop liner that covers the bottom surface 130 of the opening 122. In some examples, which are not intended to be limiting, the second etch stop liner 152 is formed from a polysilicon material, a nitride, or the like.

The etch stop liners 150, 152 can be non-conformal in that the liners can be formed without being continuously uniform in thickness along the side walls 128 and the bottom surface 130 of the opening 122. The materials of the etch stop liners 150, 152 are different, and any materials may be used such that the first liner is selectively etchable with respect to the second liner. In other words, in the method of the present disclosure an etch chemistry can be selected to remove the first liner 150 while leaving substantially intact the second liner 152. The liners 150, 152 can be removed, for example but not limited to, using a resist strip process. For example, a carbon liner can be etched by an oxygen-based dry plasma. Other removal processes can include oxygen and ammonia dry plasma or use of a hydrogen forming gas.

The thicknesses of the liners 150, 152 can vary widely, but in some examples, each of the liners can have a thickness independently selected to be within about 10 nm to about 3 nm, and in some embodiments each liner 150, 152 can include a single layer or multiple overlapping layers.

Figure 4:
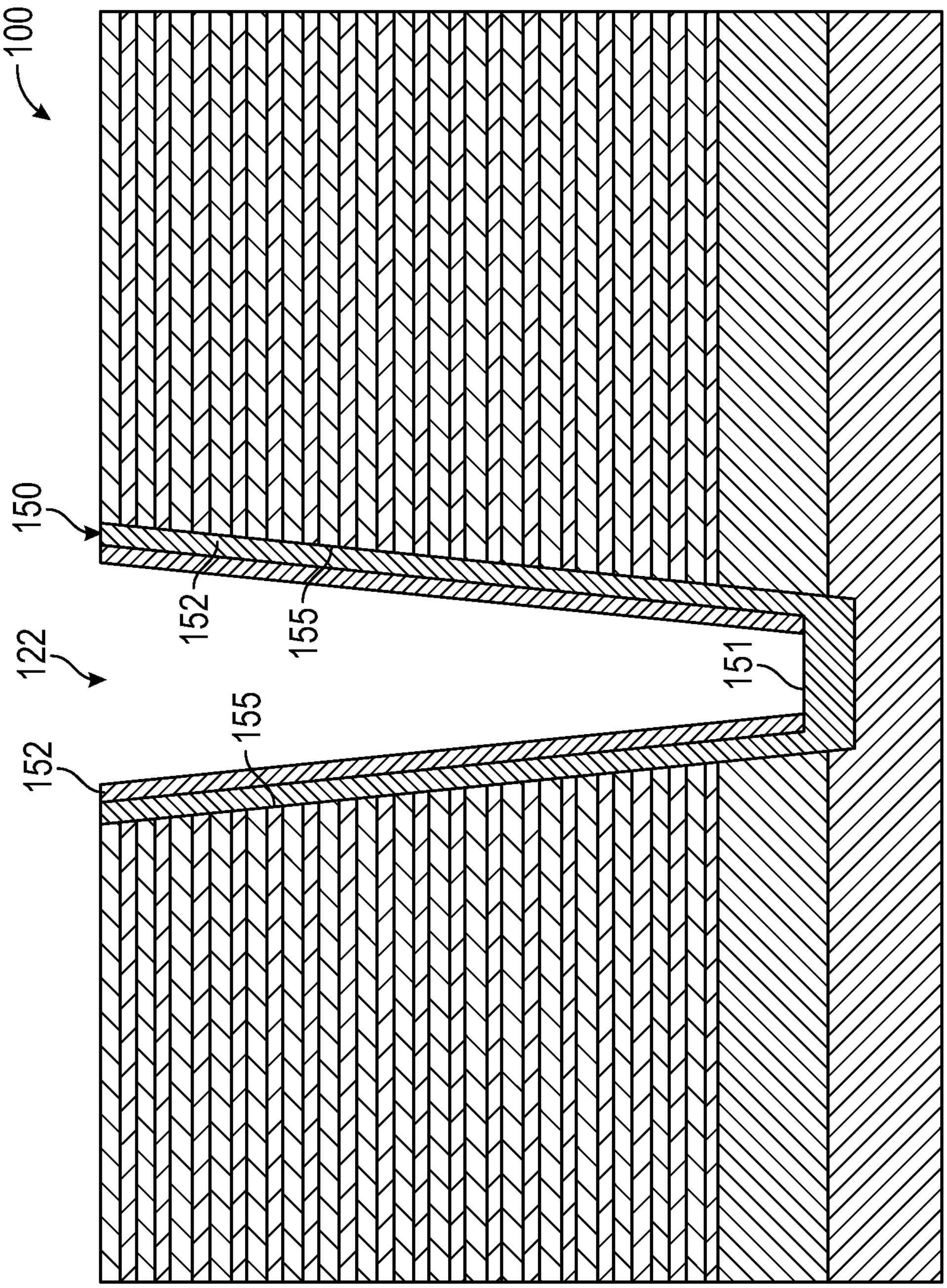
FIG. 4 is a schematic cross-sectional view of a step in a method for processing the workpiece of FIG. 3 to remove a portion of the second etch resistant liner that overlies a bottom surface the tapered opening in the tier stack, according to various embodiments.

As shown in FIG. 4, in embodiments in which the portion 153 of the second etch stop liner 152 is present over the portion 151 of the first etch stop liner 150 that overlies the bottom surface 130 of the opening 122, the portion 153 of the second etch stop liner 152 can be etched away, exposing the portion 151 of the first etch stop liner 150.

Figure 5:
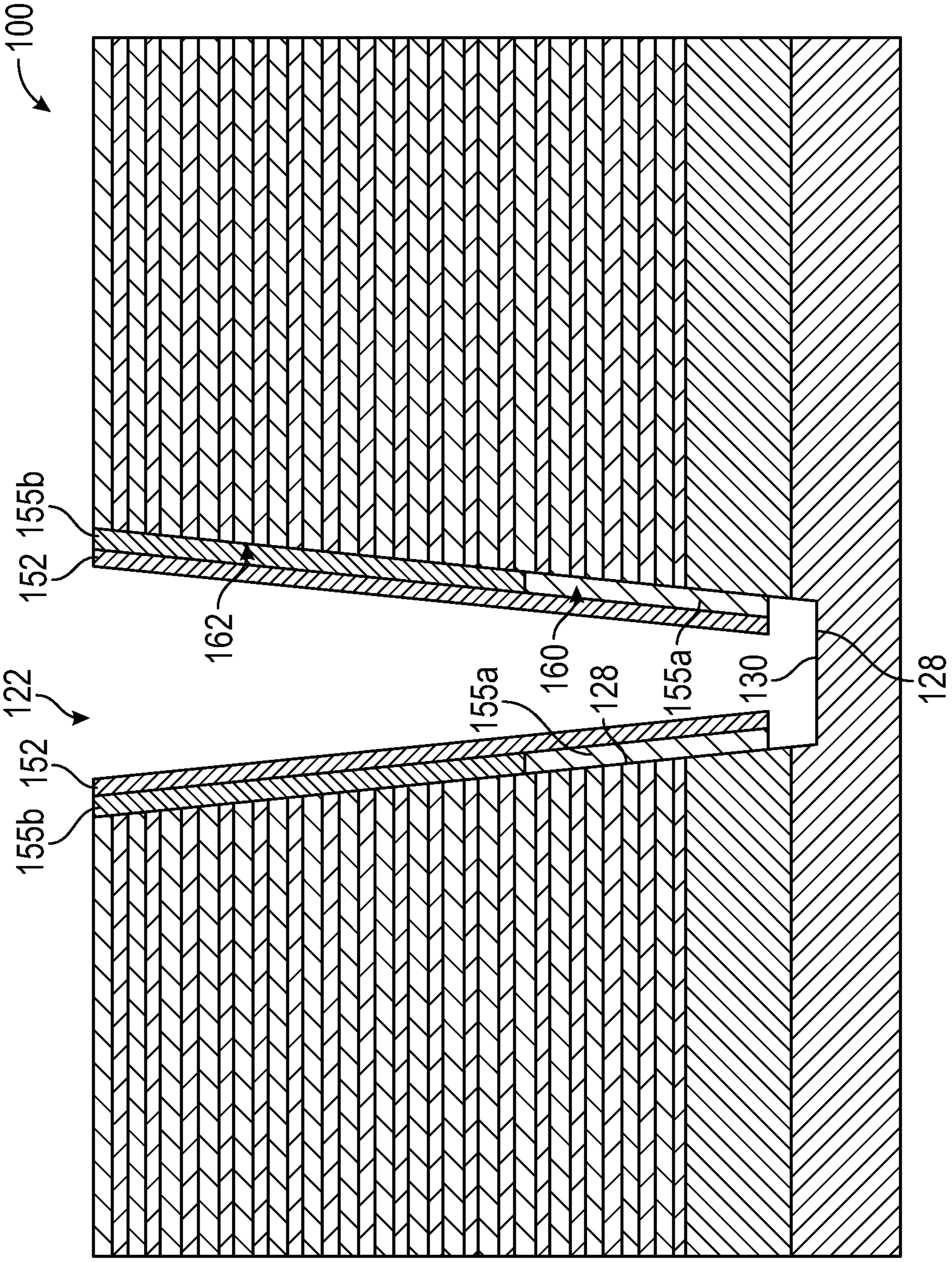
FIG. 5 is a schematic cross-sectional view of a step in a method in which a portion of the first etch resistant liner is exhumed from under the second etch resistant liner, exposing a first portion of the walls of the tapered opening, according to various embodiments.

Referring now to FIG. 5, a predetermined first portion 155A of the first etch stop liner 150 is exhumed from beneath the second etch stop liner 152 to expose the sidewalls 128 in a first region 160 of the tapered opening 122. A second portion 155B of the first liner 150 remains intact over the sidewalls 128 in a predetermined second region 162 of the opening 122.

Figure 6:
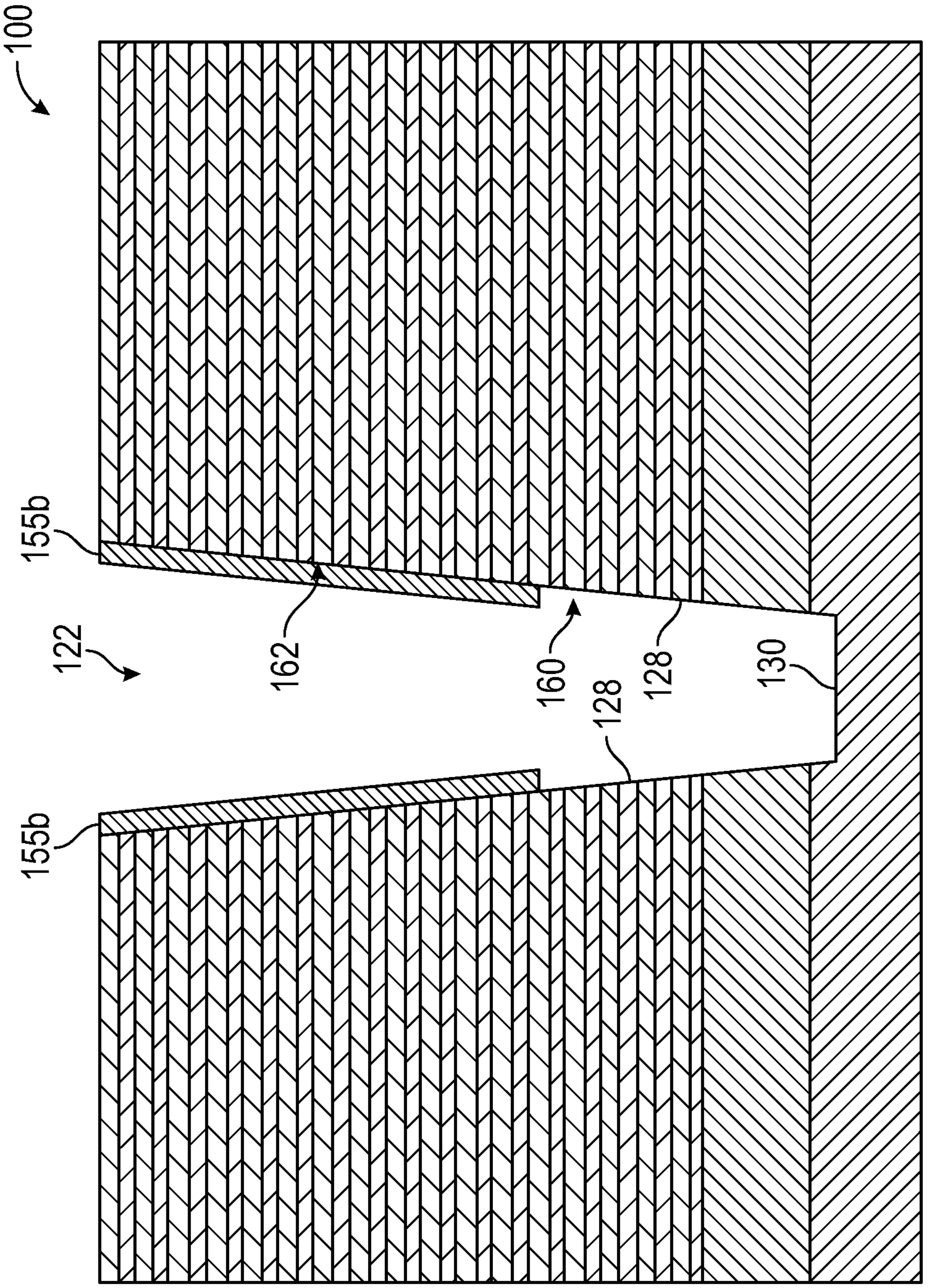
FIG. 6 is a schematic cross-sectional view of a step in a method in which the second etch resistant liner is removed from the first etch resistant liner, according to various embodiments.

As shown in FIG. 6, the second etch stop liner 152 may then be fully removed, exposing the first portion 155B of the first etch stop liner 150. The second portion 155B of the first etch stop liner 150 remains in place overlying the sidewalls 128 in the second region 162 of the opening 122.

Figure 7A:
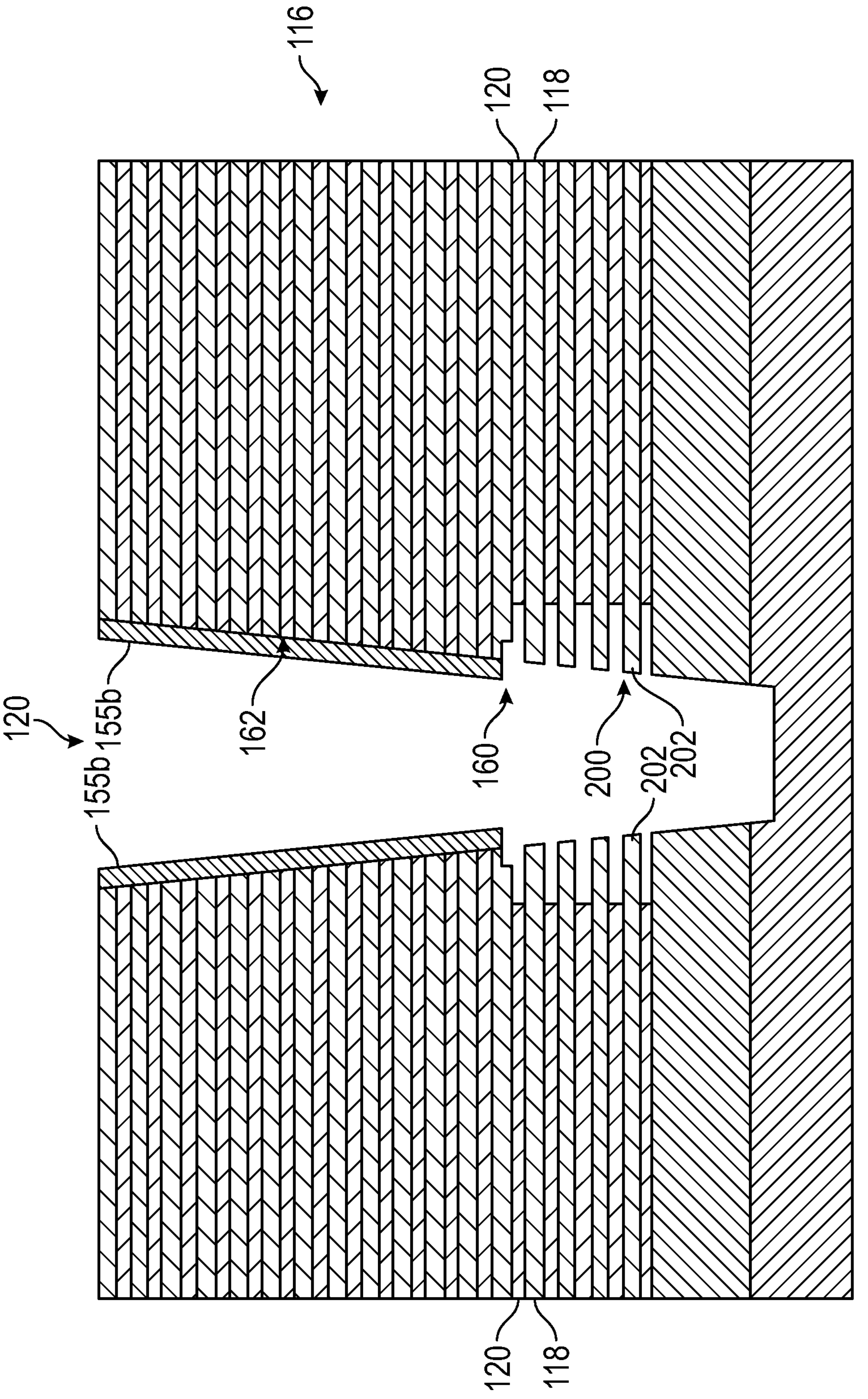
FIG. 7A is a schematic cross-sectional view of a step in a method in which the nitride layers in the stack within the first portion of the opening uncovered by the first etch stop liner are etched back a predetermined distance to form a first set of cantilevered dielectric structures, according to various embodiments.
Figure 7B:
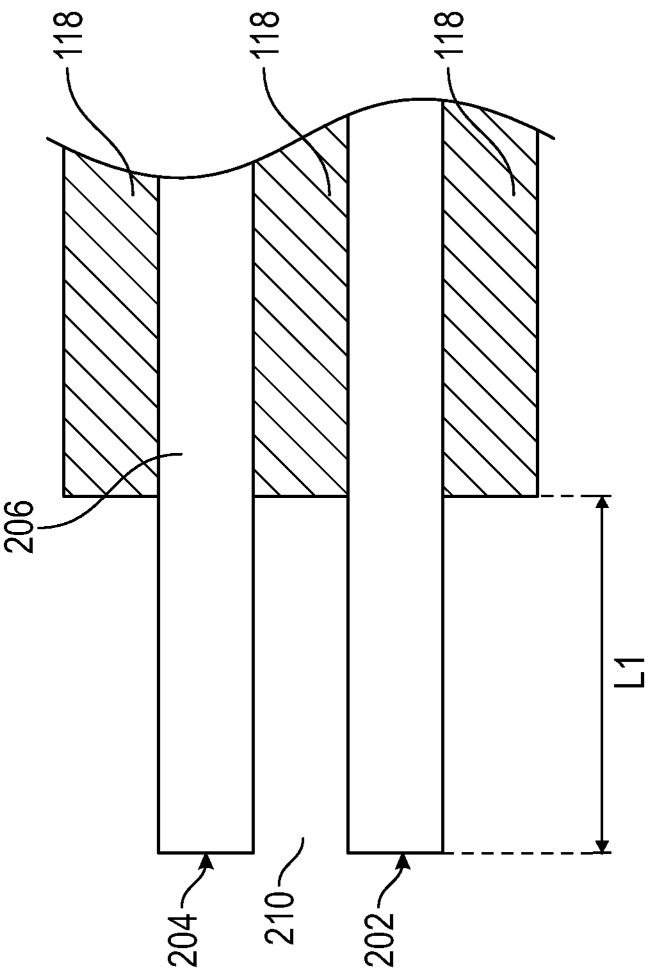
FIG. 7B is a schematic cross-sectional view of the cantilevered dielectric structures formed in FIG. 7A, according to various embodiments.

Referring to FIG. 7A, a first tier stack etch step may then be used to selectively etch back the layers 120 of the nitride materials along the walls 128 in the first region 160 of the opening 122 that were previously protected by the first portion 155A of the first liner 150 to form first tier openings 210. The first tier stack etch step leaves substantially intact the layers of dielectric materials 118 in the first region 160, and forms a first set 200 of cantilevered dielectric arms 202 in the tier stack in the first region 160 of the opening. As further illustrated in FIG. 7B, the cantilivered dielectric arms 202 each have a free end 204 and a fixed end 206. The fixed ends 206 are supported between overlying and underlying regions of the layers 118 of nitride materials. As illustrated in FIG. 7B, the cantilevered dielectric arms 202 have a first length L1 that is substantially the same within the first region 160.

Figure 8:
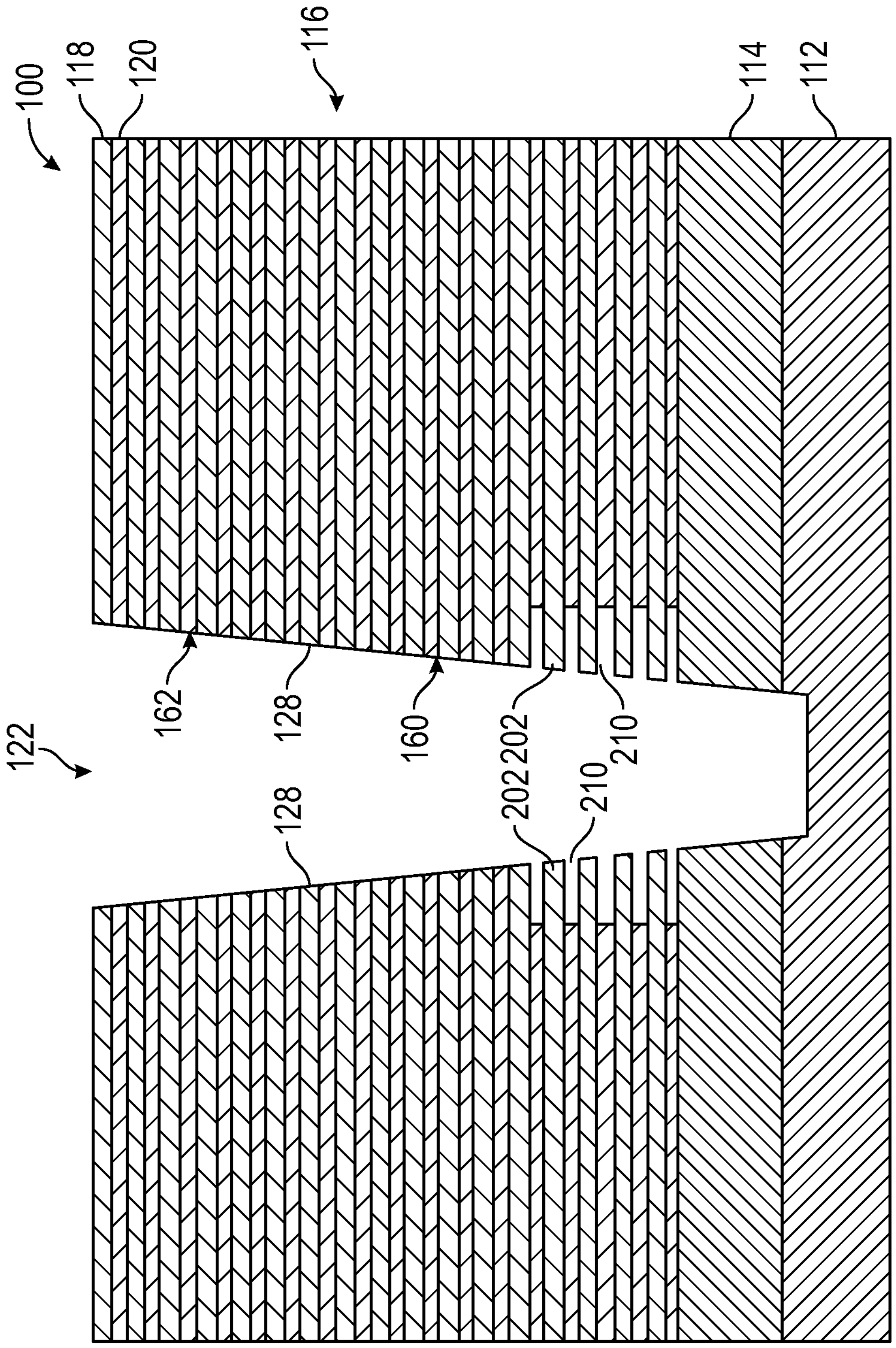
FIG. 8 is a schematic cross-sectional view of a step in a method in which the first etch stop liner is removed from the tapered opening in the tier stack, exposing a second portion of the walls of the tapered opening, according to various embodiments.
Figure 9:
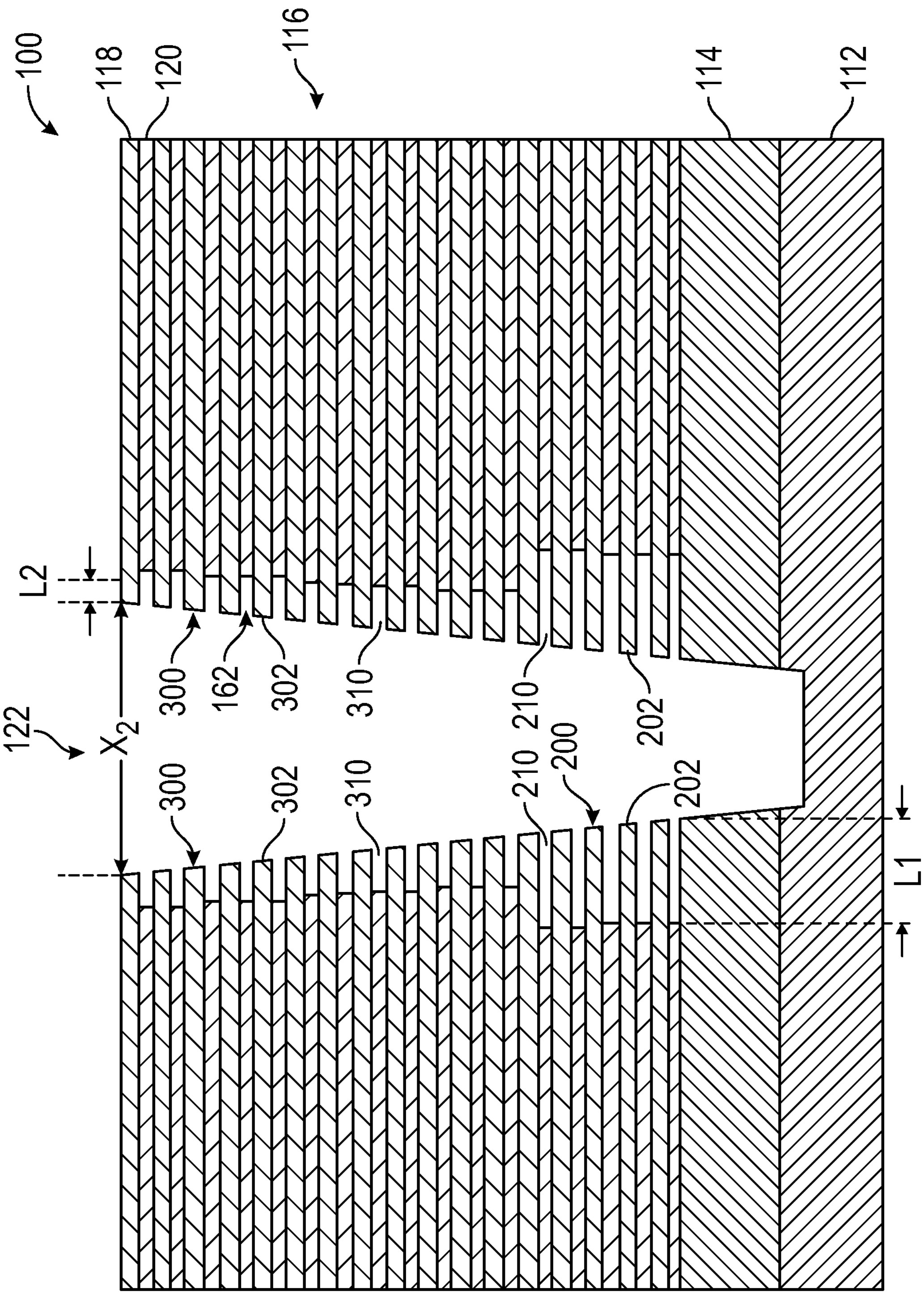
FIG. 9 is a schematic cross-sectional view of a step in a method in which the nitride layers in the stack within the second portion of the opening are etched back a predetermined distance to form a second set of cantilevered dielectric structures, according to various embodiments.

As shown in FIG. 8, the second portion 155B of the first liner 150 are then removed, exposing the sidewalls 128 in the second region 162 of the opening 122. Then, as shown in FIG. 9, a second tier stack etch step can be used to selectively remove the layers of the nitride materials in the second region 162 of the opening 122 that were previously protected by the opposed second portions 155A, 155B of the second etch stop liner 152, forming second tier openings 310. The second tier etch step leaves intact the dielectric layers in the second region 162 and forms a second set 300 of cantilevered dielectric arms 302 in the tier stack in the second regions of the opening. The second set of cantilivered dielectric arms 302 each have a second length L2 that is less than the first length L1 of the cantilevered dielectric arms 202 in the first set 200 (FIGS. 7A-7B).

In the non-limiting example described in detail above, the process of the present disclosure provides a workpiece 100 that includes: (1) a first set 200 of cantilevered dielectric arms in a first region 160 of the opening 122 that each have a predetermined length L1, and a second set of cantilivered dielectric arms 300 in a second region 162 of the opening 122 that each have a predetermined length L2, wherein L2 is less than L1. However, any number of etch stop liners may be used in the process of the present disclosure to provide multiple regions along the walls 128 of the opening 122, each of the multiple regions having cantilevered dielectric arms with a predetermined length. For example, multiple etch stop liners can be used to form cantilevered dielectric arms along the walls 128 of the opening 122, wherein the cantilevered arms have lengths that gradually taper in a direction opposite to the direction of the taper of the opening 122 itself. Or, three sets of etch stop liners can be used to form a first set of cantilevered dielectric arms near the first end 124 of the opening 122 proximal the supporting substrates 114, 112, a second set of cantilevered dielectric arms near the second end 126 of the opening 122 distal the supporting substrates 114, 112, and a third set of cantilevered dielectric arms in a region of the opening 122 between the first end 124 and the second end 126. The cantilevered dielectric arms near the second end 126 of the opening have a length L1, and the cantilevered dielectric arms near the first end 126 of the opening have a length L2, and the cantilevered dielectric arms between the first end 126 and the second end 126 have a length L3, with L2>L3>L1.

Following the second tier etch step illustrated in FIG. 9, the layers 118 of the nitride materials in the tiers 116 are selectively removed and conductive materials formed in the resulting spaces. The layers 118 of the nitride materials may be removed, such as by a wet etch process (e.g., an isotropic etch process), that utilizes an etch chemistry selective for the nitride materials in the layers 118 relative to the dielectric materials 120.

The conductive materials that replace the nitride materials in the layers 118 correspond to word lines (e.g., access lines) of the memory cells and other of the conductive materials in the tiers 116 correspond to select gate sources/select gate drains of the memory cells. In some examples, which are not intended to be limiting, the conductive materials deposited to replace the nitrides in the layers 118 include a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or a combination thereof. The conductive materials may be deposited to replace the nitride layers 118 by conventional techniques. In some embodiments, the conductive materials residing the layers 118 previously occupied by the nitrides are polysilicon.

A conductive material, such as a metal-containing material, polysilicon, or other conventional material, is then deposited in the opening 122, forming the source of the semiconductor memory device. The conductive material forming the source may include, but is not limited to, a tungsten-containing material, a titanium-containing material, or a combination thereof. The forming of the source may, for example, include a silicided metal material, such as a silicided tungsten ($WSi_x$) material or tungsten (W). In some examples, the conductive material deposited in the opening 122 may also include a liner material, such as titanium nitride (TiN), tungsten nitride (WN), or a combination (e.g., a laminate) of titanium and TiN, under the metal-containing material. For example, titanium may be formed over a doped polysilicon material, followed by forming titanium silicide over the titanium. The TiN and tungsten may then be formed over the titanium silicide.

The conductive materials forming the source completely fills the opening 122, and may be substantially free of voids (e.g., air gaps). Any conductive materials formed in the opening 122 and over the tiers 116 may be removed, such as by chemical mechanical polishing (CMP).

Various deposition techniques for components of structures in the process flow of FIGS. 3-9 above can be used that are typical for the material being formed, the dimensions of the material being formed, and the architecture in which the material is being formed. Processes for forming the various materials can include, but are not limited to, chemical vapor deposition (CVD), atomic layer deposition (ALD), and physical vapor deposition (PVD). PVD can include, but is not limited to, sputtering, ion beam deposition, electron beam evaporation, pulsed laser deposition, and vacuum arc methods, among others. CVD can include, but is not limited to, plasma chemical vapor deposition and laser chemical vapor deposition, among others. Selective etching and conventional masking techniques can be used to remove selected regions in the processing discussed with respect to FIGS. 3-9. Etching procedures can include, but are not limited to, wet etching, dry etching, and atomic layer etching deposition, among others.

Figure 10:
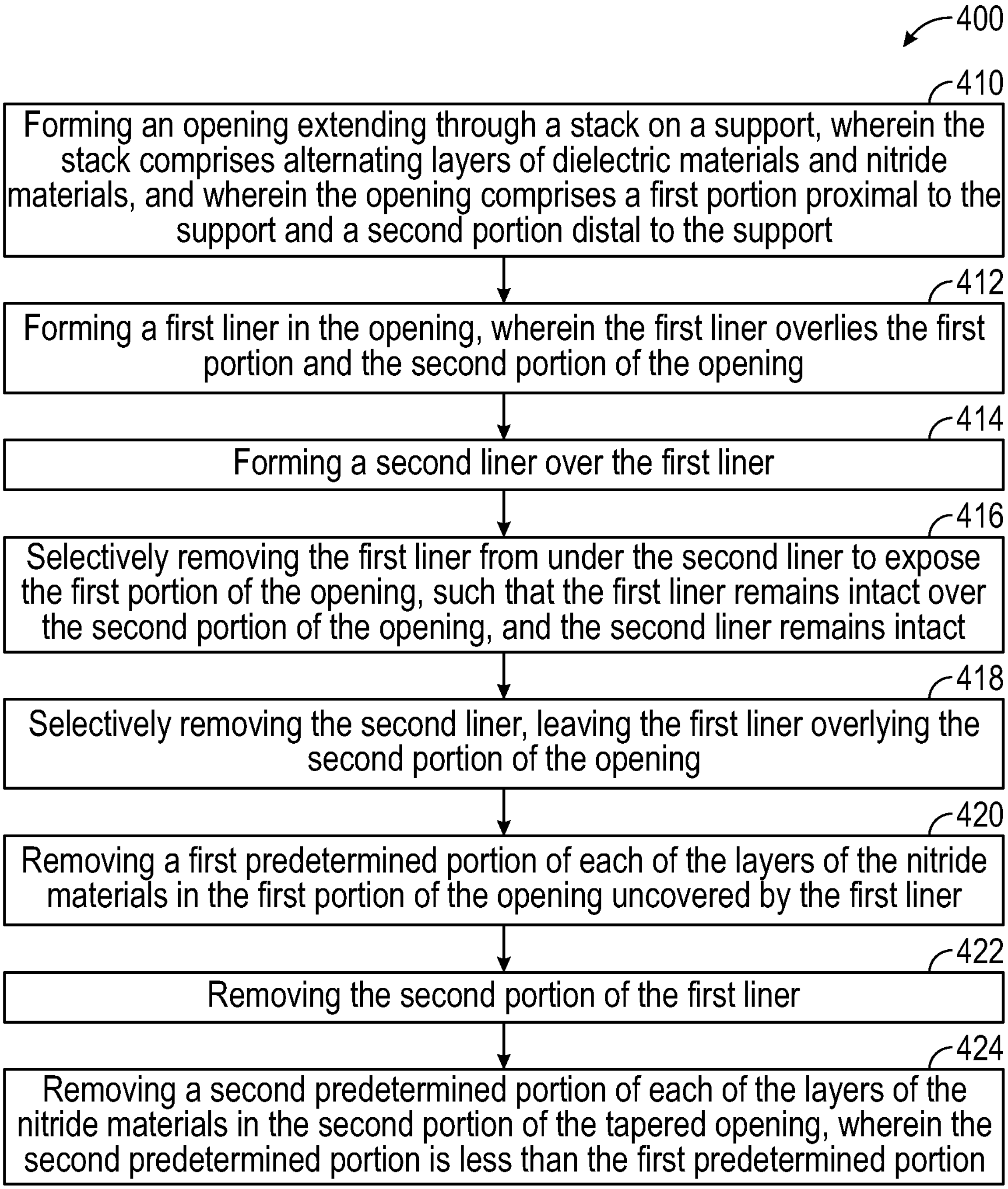
FIG. 10 is a flow diagram of features of an example method of forming a vertical contact extending through levels of a memory device, according to various embodiments.

FIG. 10 is a flow diagram of features of an embodiment of an example method 400 of forming a vertical contact extending through levels of a memory device.

At step 410, the method includes forming an opening extending through a stack on a support, wherein the stack includes a plurality of alternating layers of dielectric materials and nitride materials, and wherein the opening includes a first portion proximal to the support and a second portion distal to the support.

At step 412, the method 400 includes forming a first liner in the opening, wherein the first liner overlies the first portion and the second portion of the opening At step 414, the method 400 includes forming a second liner over the first liner.

At step 416, the method 400 includes selectively removing the first liner from under the second liner to expose the first portion of the opening, such that the first liner remains intact over the second portion of the opening, and the second liner remains intact.

At step 418, the method 400 includes selectively removing the second liner, leaving the first liner overlying the second portion of the opening.

At step 420, the method 400 includes removing a first predetermined portion of each of the layers of the nitride materials in the first portion of the opening uncovered by the first liner. At step 422, the method 400 includes removing the second portion of the first liner.

At step 424, the method 400 includes removing a second predetermined portion of each of the layers of the nitride materials in the second portion of the tapered opening, wherein the second predetermined portion is less than the first predetermined portion.

Figure 11:
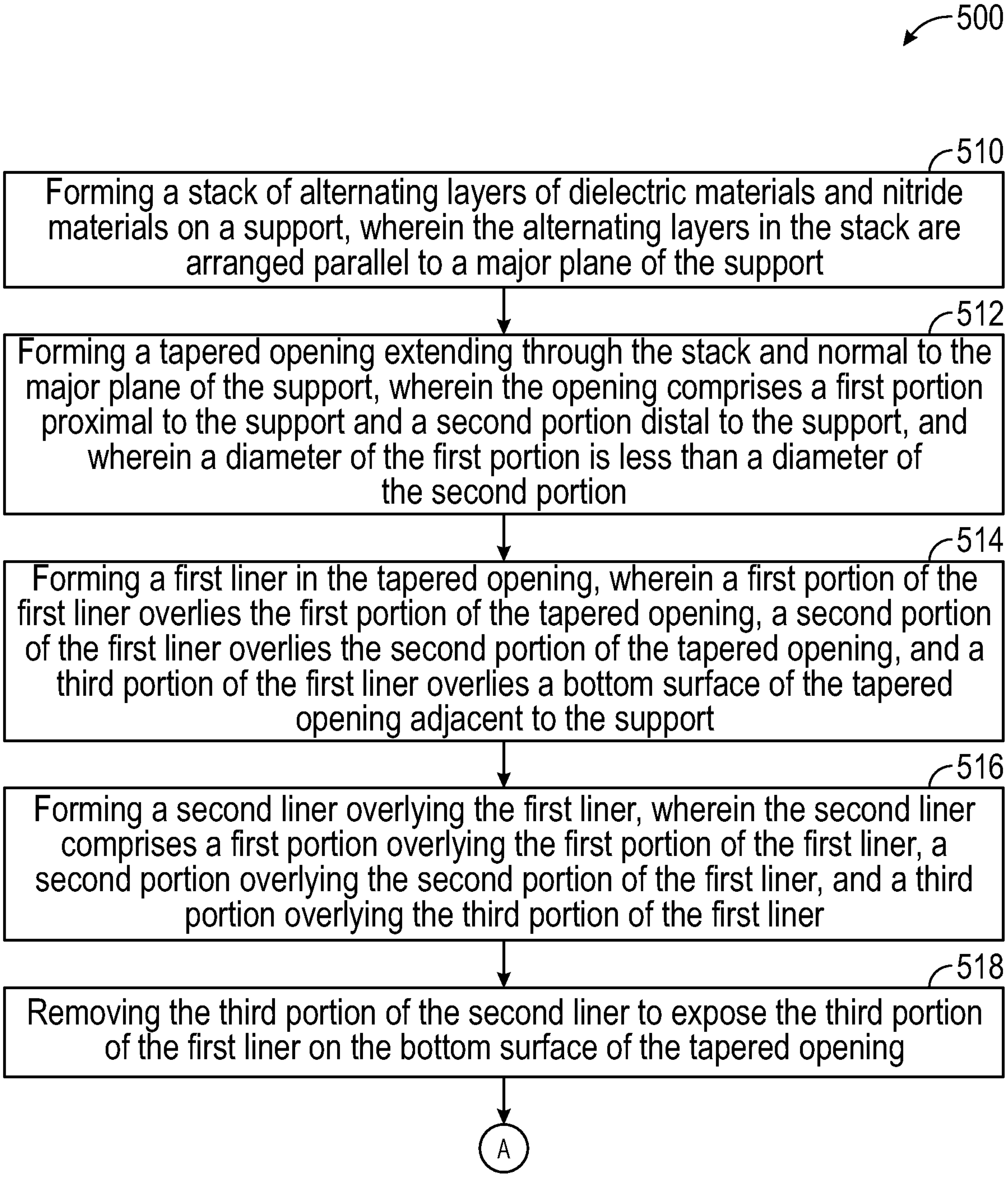
FIG. 11 is a flow diagram of features of another example method of forming a vertical contact extending through levels of a memory device, according to various embodiments.
Figure 11:
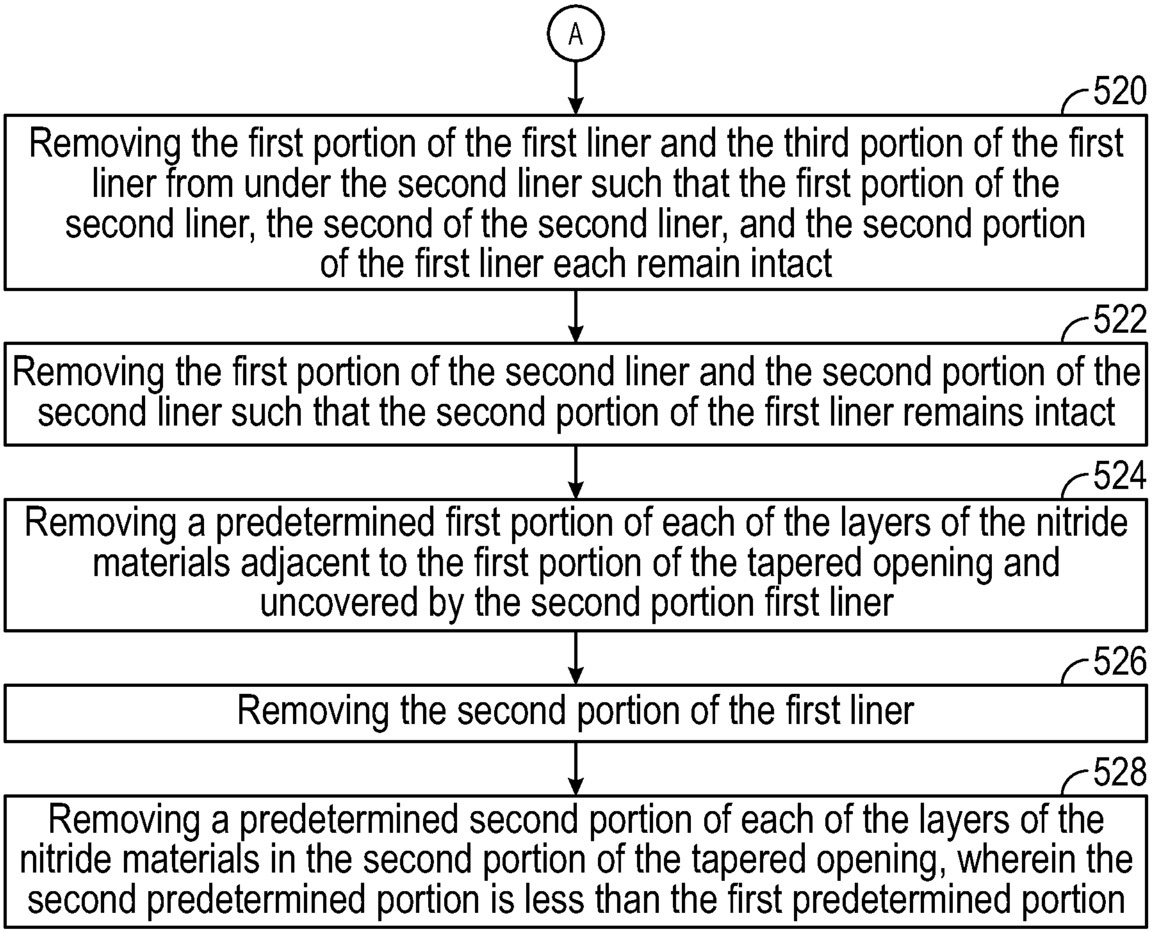

FIG. 11 is a flow diagram of features of an embodiment of another example method 500 of forming a memory device.

At 510, the method 500 includes forming a stack of alternating layers of dielectric materials and nitride materials on a support, wherein the alternating layers in the stack are arranged parallel to a major plane of the support.

At step 512, the method 500 includes forming a tapered opening extending through the stack and normal to the major plane of the support, wherein the opening includes a first portion proximal to the support and a second portion distal to the support, and wherein a diameter of the first portion is less than a diameter of the second portion.

At step 514, the method 500 includes forming a first liner in the tapered opening, wherein a first portion of the first liner overlies the first portion of the tapered opening, a second portion of the first liner overlies the second portion of the tapered opening, and a third portion of the first liner overlies a bottom surface of the tapered opening adjacent to the support.

At step 516, the method 500 includes forming a second liner overlying the first liner, wherein the second liner includes a first portion overlying the first portion of the first liner, a second portion overlying the second portion of the first liner, and a third portion overlying the third portion of the first liner.

At step 518, the method 500 includes removing the third portion of the second liner to expose the third portion of the first liner on the bottom surface of the tapered opening.

At step 520, the method 500 includes removing the first portion of the first liner and the third portion of the first liner from under the second liner such that the first portion of the second liner, the second portion of the second liner, and the second portion of the first liner each remain intact.

At step 522, the method 500 includes removing the first portion of the second liner and the second portion of the second liner such that the second portion of the first liner remains intact.

At step 524, the method 500 includes removing a predetermined first portion of each of the layers of the nitride materials adjacent to the first portion of the tapered opening and uncovered by the second portion of the first liner.

At step 526, the method 500 includes removing the second portion of the first liner.

At step 528, the method 500 includes removing a predetermined second portion of each of the layers of the nitride materials in the second portion of the tapered opening, wherein the second predetermined portion is less than the first predetermined portion.

In some examples, the memory array of a 3D memory device can extend in a horizontal plane along a substrate, which can be designated as a x-y plane, and in a vertical direction, taken as the z direction perpendicular to the x-y plane. Design considerations can be implemented with the 3D memory arrays such as using a circuit-under-array (CuA) architecture to enhance reduction of die size or increase utilization of space in a die. CuA refers generally to circuitry located in a memory die under a memory array of the memory die. The CuA can include control logic and sensing circuitry for sensing the programmed data states of memory cells of the memory array. With the control logic and sensing circuitry fabricated below the memory array, using semiconductor processing that can include CMOS processing technology, CuA can be referred to as CMOS under array.

For a 3D NAND memory array, which can include vertical strings of the memory cells of the present disclosure, using floating gate transistors or charge trap transistors, and connections from data lines positioned above the 3D NAND, vertical connections extending through the 3D NAND memory array or through memory breaks within the 3D NAND memory array can be used to couple to sensing circuitry and other control logic of the CuA for the memory array. A CuA architecture, which allows for circuits that operate with a 3D memory array to be structured in a space in the substrate below the 3D memory array, provides capabilities for higher densities of memory cells. These capabilities address a desire to limit increases in the area (horizontal plane) of the memory die. For continued increases in memory capacity, other design considerations can be implemented that also provide for enhancements to reduction of parasitic structures in operation of the memory device.

Various memory device formats can be structured in a CuA architecture, such as but not limited to NOR or NAND architecture semiconductor memory arrays. Both NOR and NAND flash architecture semiconductor memory arrays are accessed through decoders that activate specific memory cells by selecting the access line coupled to their gates. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows between the source line and the data line through each series-coupled group, restricted only by the selected memory cells of each group, placing current encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context to refer to any memory cell(s) that can store more than one bit of data per cell (i.e., that can represent more than two programmed states). The sensing and control circuitry for such NOR or NAND architecture semiconductor memory arrays can be structured beneath the respective memory array in a CuA architecture.

In a CuA architecture for a memory die having a 3D memory array, the CuA region can include circuits for controlling the operation of the 3D memory array. One or more control circuits of the CuA can provide control signals to the 3D memory array in order to perform a read operation or a write operation on the 3D memory array. The CuA can include one or more of control circuitry, state machines, decoders, sense amplifiers, read/write circuits, and controllers. These circuits can implement one or more memory array operations including erasing, programming, or reading operations. For example, the CuA region can include an on-chip memory controller for determining row and column address, access line and data line addresses, memory array enable signals, and data latching signals. The operations on the 3D memory array are typically performed to access one or more memory cells in response to requests from other circuits on the memory die or a device external to the memory die. The CuA region can include pad structures to couple the memory array or one or more circuits in the CuA region to other portions of the die of the memory device, or to couple to devices external to the memory device.

To better illustrate the methods, structures, and apparatuses described herein, a non-limiting set of Example embodiments are set forth below as Examples.

Example A includes a method for making of forming a vertical contact extending through levels of a memory device, the method comprising: forming an opening extending through a stack on a support, wherein the stack comprises a plurality of alternating layers of dielectric materials and nitride materials, and wherein the opening comprises a first portion proximal to the support and a second portion distal to the support; forming a first liner in the opening, wherein the first liner overlies the first portion and the second portion of the opening; forming a second liner over the first liner; selectively removing the first liner from under the second liner to expose the first portion of the opening, such that the first liner remains intact over the second portion of the opening, and the second liner remains intact; selectively removing the second liner, leaving the first liner overlying the second portion of the opening; removing a first portion of each of the layers of the nitride materials in the first portion of the opening uncovered by the first liner; removing the second portion of the first liner; and removing a second portion of each of the layers of the nitride materials in the second portion of the opening, wherein the second portion is less than the first portion.

In Example B, the subject matter of Example A includes, prior to removing the first liner from under the second liner, removing a portion of the second liner from a region adjacent the support.

In Example C, the subject matter of Example A or B includes, wherein the removing the first liner from under the second liner comprises applying a first etchant composition to the first liner, and wherein the first etchant composition is chosen to remove the first liner while leaving intact the stack.

In Example D, the subject matter of Example C includes, wherein the first liner comprises carbon.

In Example E, the subject matter of any of Examples A to D includes, wherein removing the second liner comprises applying a second etchant composition to the second liner, and wherein the second etchant composition is chosen to remove the second liner while leaving intact the first liner and the stack.

In Example F, the subject matter of Example E includes, wherein the second liner is chosen from a polysilicon and a nitride.

In Example G, the subject matter of any of Examples A to F includes, wherein the method includes forming the opening to extend from a level above the stack to a level below the stack.

Example H includes a method of forming a vertical contact extending through levels of a memory device, the method comprising: forming a stack comprising a plurality of alternating layers of dielectric materials and nitride materials on a support, wherein the layers in the stack are arranged parallel to a major plane of the support; forming a tapered opening extending through the stack and normal to the major plane of the support, wherein the opening comprises a first portion proximal to the support and a second portion distal to the support, and wherein a diameter of the first portion is less than a diameter of the second portion;

forming a first liner in the tapered opening, wherein a first portion of the first liner overlies the first portion of the tapered opening, a second portion of the first liner overlies the second portion of the tapered opening, and a third portion of the first liner overlies a bottom surface of the tapered opening adjacent to the support; forming a second liner overlying the first liner, wherein the second liner comprises a first portion overlying the first portion of the first liner, a second portion overlying the second portion of the first liner, and a third portion overlying the third portion of the first liner; removing the third portion of the second liner to expose the third portion of the first liner on the bottom surface of the tapered opening; removing the first portion of the first liner and the third portion of the first liner from under the second liner such that the first portion of the second liner, the second portion of the second liner, and the second portion of the first liner each remain intact; removing the first portion of the second liner and the second portion of the second liner such that the second portion of the first liner remains intact; removing a predetermined first portion of each of the layers of the nitride materials adjacent to the first portion of the tapered opening and uncovered by the second portion of the first liner; removing the second portion of the first liner; and removing a predetermined second portion of each of the layers of the nitride materials in the second portion of the tapered opening, wherein the second predetermined portion is less than the first predetermined portion.

In Example I, the subject matter of Example H includes, wherein the removing the first liner from under the second liner comprises applying a first etchant composition to the first liner, and wherein the first etchant composition is chosen to remove the first liner while leaving intact the second liner and the stack.

In Example J, the subject matter of Example H or I includes, wherein the first liner comprises carbon.

In Example K, the subject matter of any of Examples H to J includes, wherein removing the second liner comprises applying a second etchant composition to the second liner, and wherein the second etchant composition is chosen to remove the second liner while leaving intact the first liner and the stack.

In Example L, the subject matter of Example K includes, wherein the second liner is chosen from a polysilicon and a nitride.

Example M includes a workpiece, comprising a plurality of alternating layers of dielectric materials and nitride materials, wherein the dielectric materials and the nitride materials are arranged parallel to a major plane of a support; an opening extending through the plurality of alternating layers of dielectric materials and nitride materials and normal to the major plane of the support, wherein the opening comprises a first portion proximal to the support and a second portion distal to the support; wherein the layers of the dielectric materials proximal to the first portion of the opening comprise first cantilevered arms with a first length, and the layers of the dielectric materials proximal to the second portion of the opening comprise second cantilevered arms with a second length, wherein the first length is greater than the second length; and wherein the workpiece is processable to form a semiconductor device.

In Example N, the subject matter of Example M includes, wherein the opening is tapered, and wherein the first portion of the opening has a width less than the second portion of the opening.

In Example O, the subject matter of Examples M or N includes, wherein the opening forms a well having a bottom surface on the support.

In Example P, the subject matter of any of Examples M to O includes, wherein each of the cantilevered arms extend to the opening, and the nitride layers are recessed from the opening.

In Example Q, the subject matter of any of Examples M to P includes, wherein the cantilevered arms of each dielectric material layer extend in a direction parallel to the major plane of the support, and wherein the cantilevered arms are supported by at least one adjacent insulating layer.

In Example R, the subject matter of any of Examples M to Q includes, wherein the opening comprises a third portion between the first portion and the second portion, and the dielectric layers proximal to the third portion of the opening comprise third cantilevered arms with a third length, wherein the third length is between the first length and the second length.

In Example S, the subject matter of any of Examples M to R includes, wherein the cantilevered arms have a gradient of lengths with a maximum length proximal to the support and a minimum length distal to the support.

Example T includes a structure processable to form a semiconductor memory device, the structure comprising: a stack comprising a plurality of alternating dielectric layers and nitride layers, wherein the dielectric layers and the nitride layers in the stack are arranged parallel to a major plane of a support; a tapered opening extending through the stack and normal to the major plane of the support, wherein the opening comprises a first portion proximal to the support and a second portion distal to the support, and wherein a diameter of the first portion is less than a diameter of the second portion; wherein the dielectric layers in the stack extend parallel to the major plane of the support and have free ends extending to the tapered opening, wherein the nitride layers in the stack proximal the first portion of the opening are recessed a first distance from the tapered opening, and the nitride layers in the stack proximal the second portion of the tapered opening are recessed a second distance from the tapered opening; and wherein the first distance is greater than the second distance.

Example U is an apparatus comprising means to implement of any of Examples A to T.

Example V is a system to implement of any of Examples A to T.

Each of these non-limiting Examples can stand on its own, or can be combined in various permutations or combinations with one or more of the other examples.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method for making of forming a vertical contact extending through levels of a memory device, the method comprising:

forming an opening extending through a stack on a support, wherein the stack comprises a plurality of alternating layers of dielectric materials and nitride materials, and wherein the opening comprises a first portion proximal to the support and a second portion distal to the support;

forming a first liner in the opening, wherein the first liner overlies the first portion and the second portion of the opening;

forming a second liner over the first liner;

selectively removing the first liner from under the second liner to expose the first portion of the opening, such that the first liner remains intact over the second portion of the opening, and the second liner remains intact;

selectively removing the second liner, leaving the first liner overlying the second portion of the opening;

removing a first portion of each of the layers of the nitride materials in the first portion of the opening uncovered by the first liner;

removing the second portion of the first liner; and removing a second portion of each of the layers of the nitride materials in the second portion of the opening, wherein the second portion is less than the first portion.

2. The method of claim 1, further comprising, prior to removing the first liner from under the second liner, removing a portion of the second liner from a region adjacent the support.

3. The method of claim 1, wherein the removing the first liner from under the second liner comprises applying a first etchant composition to the first liner, wherein the first etchant composition is chosen to remove the first liner while leaving intact the stack.

4. The method of claim 3, wherein the first liner comprises carbon.

5. The method of claim 1, wherein removing the second liner comprises applying a second etchant composition to the second liner, wherein the second etchant composition is chosen to remove the second liner while leaving intact the first liner and the stack.

6. The method of claim 5, wherein the second liner is chosen from a polysilicon and a nitride.

7. The method of claim 1, wherein the method includes forming the opening to extend from a level above the stack to a level below the stack.

8. A workpiece, comprising:

a plurality of alternating layers of dielectric materials and nitride materials, wherein the dielectric materials and the nitride materials are arranged parallel to a major plane of a support;

an opening extending through the plurality of alternating layers of dielectric materials and nitride materials and normal to the major plane of the support, wherein the opening comprises a first portion proximal to the support and a second portion distal to the support;

wherein the layers of the dielectric materials proximal to the first portion of the opening comprise first cantilevered arms with a first length, and the layers of the dielectric materials proximal to the second portion of the opening comprise second cantilevered arms with a second length, wherein the first length is greater than the second length; and wherein the workpiece is processable to form a semiconductor device.

9. The workpiece of claim 8, wherein the opening is tapered, and wherein the first portion of the opening has a width less than the second portion of the opening.

10. The workpiece of claim 9, wherein the opening forms a well having a bottom surface on the support.

11. The workpiece of claim 8, wherein each of the cantilevered arms extend to the opening, and the nitride layers are recessed from the opening.

12. The workpiece of claim 8, wherein the cantilevered arms of each dielectric material layer extend in a direction parallel to the major plane of the support, and wherein the cantilevered arms are supported by at least one adjacent insulating layer.

13. The workpiece of claim 8, wherein the opening comprises a third portion between the first portion and the second portion, and the dielectric layers proximal to the third portion of the opening comprise third cantilevered arms with a third length, wherein the third length is between the first length and the second length.

14. The workpiece of claim 8, wherein the cantilevered arms have a gradient of lengths with a maximum length proximal to the support and a minimum length distal to the support.

15. A structure processable to form a semiconductor memory device, the structure comprising:

a stack comprising a plurality of alternating dielectric layers and nitride layers, wherein the dielectric layers and the nitride layers in the stack are arranged parallel to a major plane of a support;

a tapered opening extending through the stack and normal to the major plane of the support, wherein the opening comprises a first portion proximal to the support and a second portion distal to the support, and wherein a diameter of the first portion is less than a diameter of the second portion;

wherein the dielectric layers in the stack extend parallel to the major plane of the support and have free ends extending to the tapered opening, wherein the nitride layers in the stack proximal the first portion of the opening are recessed a first distance from the tapered opening, and the nitride layers in the stack proximal the second portion of the tapered opening are recessed a second distance from the tapered opening.

16. The structure of claim 15, wherein the first distance is greater than the second distance.

* * * * *